(12) United States Patent
Loubet et al.

(10) Patent No.: US 9,166,049 B2
(45) Date of Patent: Oct. 20, 2015

(54) METHOD TO ENHANCE STRAIN IN FULLY ISOLATED FINFET STRUCTURES

(71) Applicants: STMicroelectronics, Inc., Coppell, TX (US); International Business Machines Corporation, Armonk, NY (US)

(72) Inventors: Nicolas Loubet, Guilderland, NY (US); Ali Khakifirooz, Los Altos, CA (US); Pierre Morin, Albany, NY (US); Sanjay C. Mehta, Niskayuna, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/201,555

(22) Filed: Mar. 7, 2014

(65) Prior Publication Data
US 2015/0255605 A1    Sep. 10, 2015

(51) Int. Cl.
| H01L 21/336 | (2006.01) |
| H01L 21/8234 | (2006.01) |
| H01L 29/78 | (2006.01) |
| H01L 29/66 | (2006.01) |

(52) U.S. Cl.
CPC ...... *H01L 29/7848* (2013.01); *H01L 29/66795* (2013.01); *H01L 29/785* (2013.01); *H01L 29/7849* (2013.01)

(58) Field of Classification Search
USPC .......................................... 438/197
See application file for complete search history.

(56) References Cited

U.S. PATENT DOCUMENTS

| 2004/0075121 A1* | 4/2004 | Yu et al. ........................ 257/288 |
| 2012/0149162 A1* | 6/2012 | Zhou et al. .................... 438/289 |
| 2013/0285017 A1* | 10/2013 | Le et al. .......................... 257/27 |
| 2015/0079773 A1* | 3/2015 | Basker et al. ................. 438/510 |

* cited by examiner

*Primary Examiner* — Asok K Sarkar
(74) *Attorney, Agent, or Firm* — Allen, Dyer, Doppelt, Milbrath & Gilchrist, P.A.

(57) ABSTRACT

Methods and structures for increasing strain in fully insulated finFETs are described. The finFET structures may be formed on an insulating layer and include source, channel, and drain regions that are insulated all around. During fabrication, the source and drain regions may be formed as suspended structures. A strain-inducing material may be formed around the source and drain regions on four contiguous sides so as to impart strain to the channel region of the finFET.

23 Claims, 9 Drawing Sheets

METHOD TO ENHANCE STRAIN IN FULLY ISOLATED FINFET STRUCTURES

BACKGROUND

1. Technical Field

The technology relates to methods and structures for making strained-channel finFETs.

2. Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed in a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs. or "FD-SOI" FET. The channel, source, and drain of an FD-SOI FET is formed in a thin The second type of transistor is called a fully-depleted, silicon-on-insulator in planar semiconductor layer that overlies a thin insulator. Because the semiconductor layer and the underlying insulator are thin, the body of the transistor (that lies below the thin insulator) can act as a second gate. The thin layer of semiconductor on insulator permits higher body biasing voltages that can boost performance. The thin insulator also reduces leakage current to the transistor's body region that would otherwise occur in bulk FET devices.

SUMMARY

The described technology relates to methods and structures for making strained-channel, fully-insulated finFET devices. A fully-insulated, or fully-isolated, finFET is a finFET device in which the fin may be surrounded on all sides by an electrically insulating material, such that the fin is fully isolated from a substrate on which the fin is formed. Fully-insulated finFETs can exhibit lower leakage currents than conventional finFETs formed on bulk semiconductor substrates. According to the present embodiments, the channel regions of fully-insulated finFETs may be strained by depositing a strain-inducing material around the source and drain regions of a fin. In some embodiments, the strain-inducing material is deposited on four contiguous surfaces surrounding suspended source and drain regions.

According to some embodiments, a method for making a strained-channel, fully-insulated finFET comprises acts of forming a fin structure for a finFET in first semiconductor material at a surface of a substrate, and forming suspended source and drain regions of the fin. The suspended source and drain regions may comprise four contiguous, exposed surfaces surrounding the fin, and there may be a void between the fin and the substrate. The method may further include depositing a strain-inducing material on four contiguous surfaces surrounding the source region, and depositing a strain-inducing material on the four contiguous surfaces surrounding at least the drain region. The strain-inducing material may also be deposited on the four contiguous surfaces surrounding the source region.

In some aspects, the strain-inducing material has a chemical composition that is different from the chemical composition of the first semiconductor material. In some implementations, the strain-inducing material comprises SiGe or SiC and the first semiconductor material comprises Si. According to some aspects, forming a fin comprises orienting the fin such that a sidewall of the fin is parallel to a (110) plane of the Si semiconductor material. In some aspects, a method may comprise forming voids under the source and drain regions.

In some aspects, depositing the strain-inducing material comprises doping the strain-inducing material with donors or acceptors. In some aspects, depositing the strain-inducing material comprises epitaxially growing the strain-inducing material. In some implementations, the deposited strain-inducing material is formed so that it does not merge with strain-inducing material deposited on an adjacent fin.

According to some implementations, a method for making a strained-channel, fully-insulated finFET may further comprise heating the substrate to a temperature that converts the source and drain regions to a material having a chemical composition different from the chemical composition of the first semiconductor material. In some aspects, the converted source and drain regions include a chemical component from the strain-inducing material that induces stress in the source and drain regions.

In some implementations, a method for making a strained-channel, fully-insulated finFET may comprise forming the fin by a sidewall image transfer process. A width of a formed fin may be between approximately 1 nm and approximately 25 nm. In some aspects, a spacing between any two adjacent fins is between approximately 10 nm and approximately 50 nm. In some implementations, a fin has a width between approximately 1 nm and approximately 25 nm and a height between approximately 20 nm and approximately 50 nm.

The foregoing aspects and implementations relating to acts for making a strained-channel, fully-insulated finFET may be used in any suitable combination in one or more embodiments of methods for making a strained-channel, fully-insulated finFET.

In some embodiments, a strained-channel finFET structure comprises a source and/or a drain region of a first semiconductor material having a first chemical composition that is surrounded on four contiguous sides by a strain-inducing material having a second chemical composition that is different from the first chemical composition. In some implementations, the source and drain regions may be converted to a chemical composition that is different than a channel region of the finFET structure.

In some aspects, the strained-channel finFET structure further comprises a void between the strain-inducing material and a substrate on which the finFET structure is formed, wherein the void isolates at least part of the source region from the substrate. In some implementations, the strain-inducing material comprises SiGe or SiC and the first semiconductor material comprises Si. According to some aspects, a sidewall of a fin of the finFET structure is parallel to a (110) crystal plane of the first semiconductor material.

According to some aspects, the strain-inducing material is epitaxially grown. In some implementations, the strain-inducing material may be doped with donors or acceptors. In some aspects, the strain-inducing material surrounding a first source region on a first fin does not merge with strain-inducing material surrounding a second source region on a second fin adjacent the first fin.

In some aspects, a width of the fin is between approximately 1 nm and approximately 25 nm. In some implementations, a spacing between any two adjacent fins is between approximately 10 nm and approximately 50 nm. According to some aspects, the fin has a width between approximately 1 nm and approximately 25 nm and a height between approximately 20 nm and approximately 50 nm. In some implementations, a strained-channel finFET structure may further comprise a gate structure surrounding three sides of the fin and connected to a substrate via an insulating layer.

The foregoing aspects and implementations associated with a strained-channel finFET structure may be included in any suitable combination in one or more embodiments of a strained-channel finFET structure. Additionally, any of the above-described method embodiments may be used to fabricate any of the finFET structure embodiments.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1A:
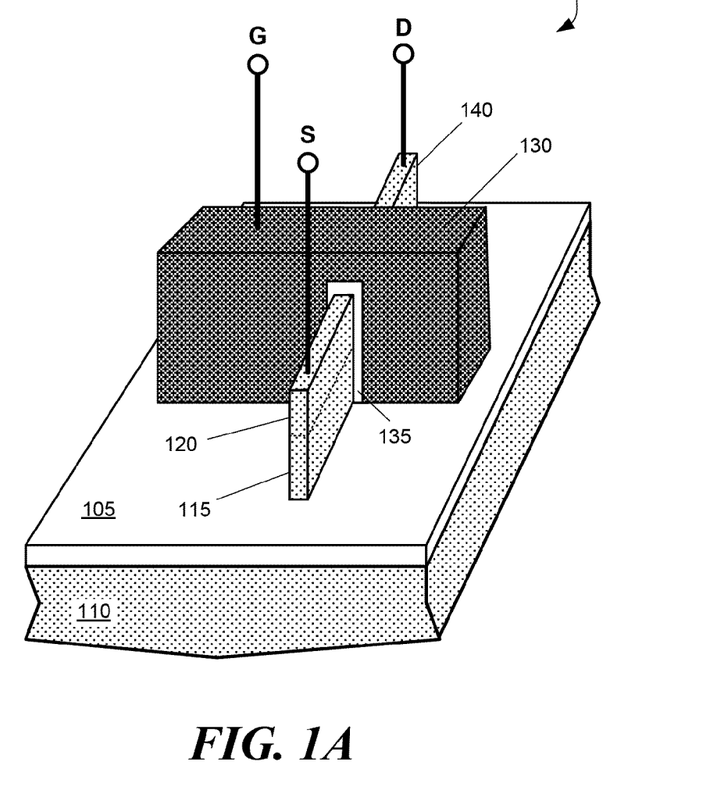
FIG. 1A is a perspective view depicting a finFET, according to some embodiments.

An example of a finFET 100 is depicted in the perspective view of FIG. 1A. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than 50 nanometers. There may be an electrically-insulating layer 105, e.g., an oxide layer, on a surface of the substrate 110. The fin may pass through the insulating layer 105, but be attached to the semiconducting substrate 110 at a lower region of the fin. A gate structure comprising a conductive gate material 130 (e.g., polysilicon) and a gate insulator 135 (e.g., an oxide) may be formed over a region of the fin. The finFET may further include a source region 120 and drain region 140 adjacent to the gate. A finFET may also include integrated source S, gate G, drain D, and body B (not shown) interconnects to provide electrical connections to the source, gate, drain, and back body regions of the device.

FinFETs like those depicted in FIG. 1A exhibit favorable electrostatic properties for scaling to high-density, low-power, integrated circuits. Because the fin and channel are raised from the substrate, the devices can exhibit reduced cross-coupling between proximal devices. For the device shown in FIG. 1A, the fin 115 may be formed from the bulk substrate 110 by an etching process, and is therefore attached to the substrate at a base region of the fin, a region occluded in the drawing by the adjacent insulator 105. The insulator 105 may be formed after the etching of the fin 115. Because the fin 115 is attached to the semiconductor substrate, leakage current and cross-coupling may occur via the base region of the fin.

Figure 1B:
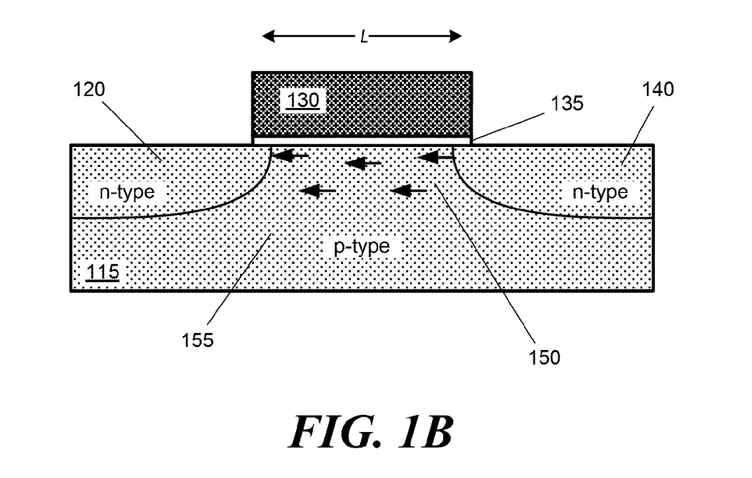
FIGS. 1B-1E depict cross-sectional views of finFET fins, according to various embodiments.
Figure 1C:
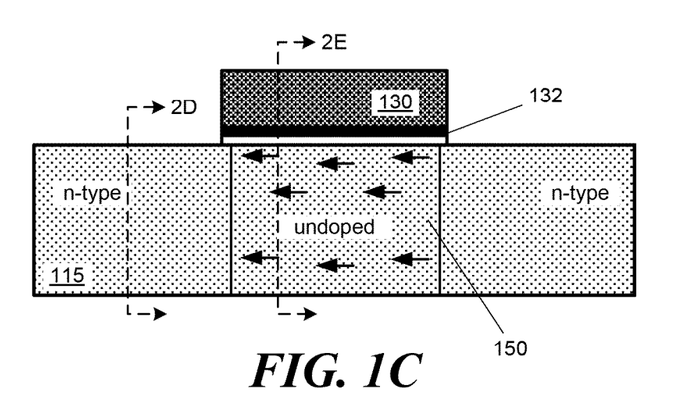

Source, channel, and drain regions of a finFET may be doped with impurities to create different regions of different conductivity types, as depicted in FIGS. 1B-1C. Several different configurations of source, channel, and drain regions are possible. According to some embodiments, source region 120 and drain region 140 may be doped to be of a first conductivity type and the channel region 150 may be doped to be of an opposite conductivity type, as depicted in FIG. 1B. The terms "source region" and "drain region" as used may include extension regions of the fins that lie between source and drain contact regions and the channel region of the finFET device.

Figure 1D:
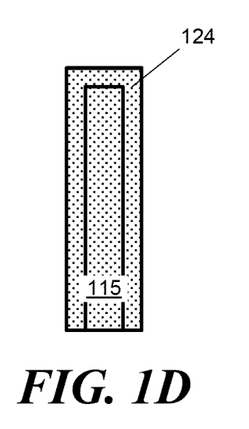

The finFET may further include a body region 155 that may be of a same conductivity type as the channel region. In some embodiments, a channel region 150 of a finFET may be undoped, as depicted in FIG. 1C. The doping of source and drain regions in a finFET may be of various geometries. As depicted in FIG. 1B, vertical portions of the fin 115 may be doped to form source 120 and drain 140 regions. Alternatively, outer sheath portions 124 of a fin 115 may be doped to form source and drain regions, as depicted in FIGS. 1C-1E.

Figure 1E:
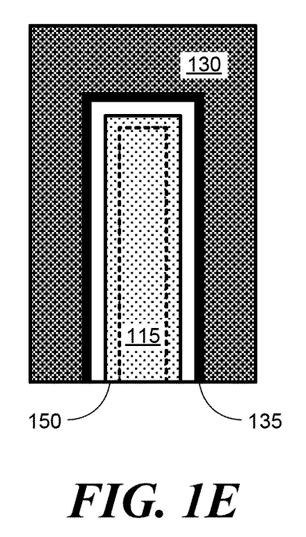

FIG. 1C and FIG. 1E depict a three-dimensional nature of a channel region 150 in a finFET, according to some embodiments. In some embodiments, the entire fin portion encased by the gate structure may be inverted and form a bulk channel rather than a surface channel. A metallic film 132 may be deposited between a gate electrode 130 and gate oxide 135 in some implementations to improve gate conductance and gate switching speeds.

The inventors have conceived of methods and structures for forming fully-insulated, strained-channel finFETs. In a fully-insulated finFET, the fin 115 may be electrically insulated from the substrate 110 by at least one intervening dielectric. Fully-insulated finFETs may exhibit less leakage current into the substrate because of the fin's electrical isolation. In addition to forming a fully-insulated fin, the inventors have conceived of methods for increasing the strain in a channel region of the finFET by inducing strain from the finFET's source and drain regions. Strain in a channel region may improve the mobility of carriers in the channel regions, and thereby improve device speed. For example compressive straining of silicon (Si) can improve the mobility of holes within silicon. Tensile straining of Si can improve electron mobility. When enough strain is applied, the performance of silicon-based transistor devices can approach or even surpass the performance of devices based on compound semiconductors (e.g., SiGe, SiC, GaAs, InP, InGaAs, GaN, AlGaAs, etc.), which may require more difficult and expensive processing techniques.

By way of introduction to the present embodiments, fins for finFET devices may be formed on silicon-on-insulator (SOI) substrates. Source and drain regions of the fins may be processed to form suspended structures with exposed surfaces on four contiguous sides that surround the source and drain regions. A strain-inducing material that has a chemical composition different than that of the fin may be formed on the exposed surfaces of the source and drain regions. The strain-inducing material may impart strain via the source and drain to an adjacent channel region in the finFETs. In some embodiments, a thermal processing step may be employed to convert the source and drain regions to a material of a different chemical composition than the original fin, so as to form stress in the source and drain region. The converted source and drain regions may then impart strain to the channel region of the finFET.

Figure 2A:
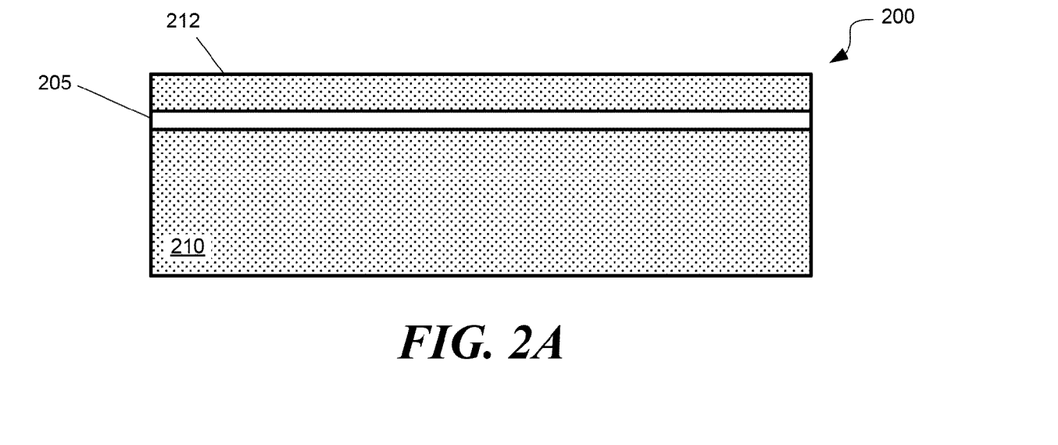
FIGS. 2A-2O depict process steps that may be used to form fully-insulated, strained-channel finFETs, according to some embodiments.
Figure 2B:
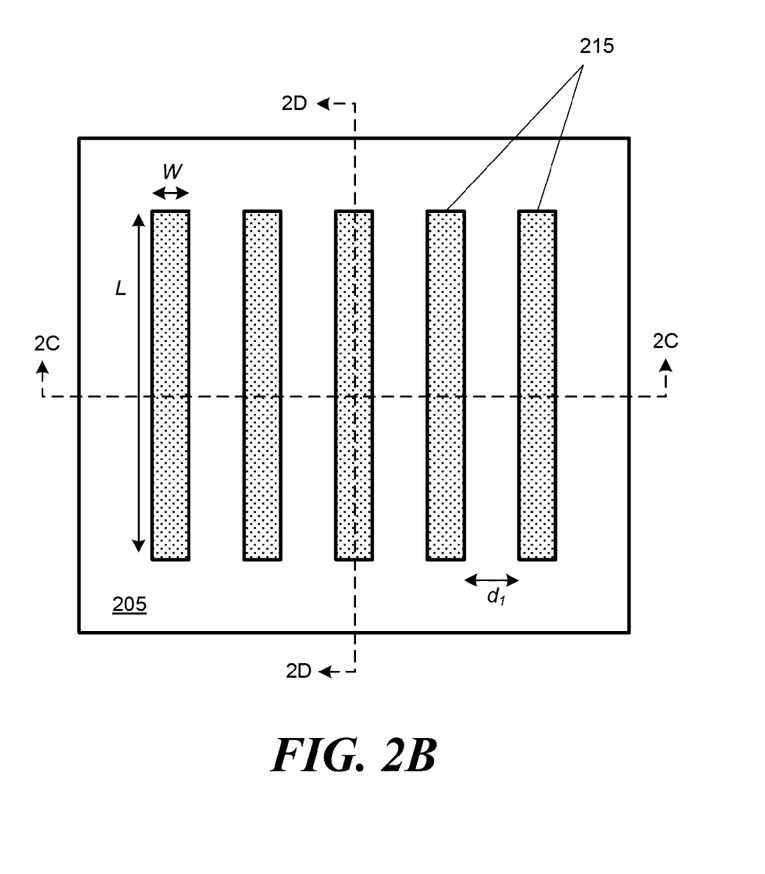
Figure 2C:
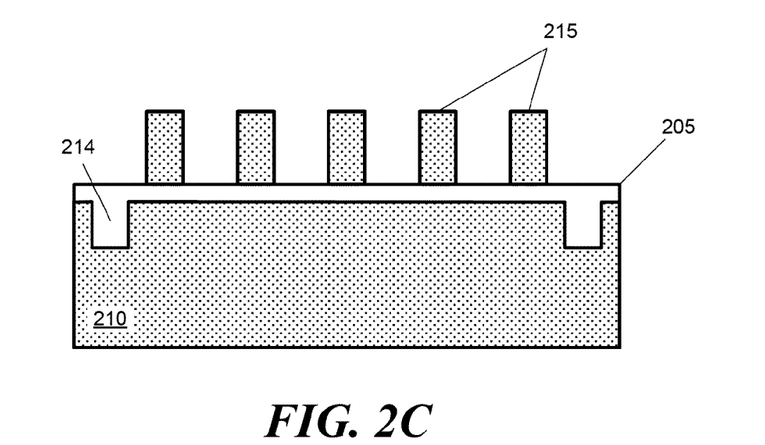
Figure 2D:
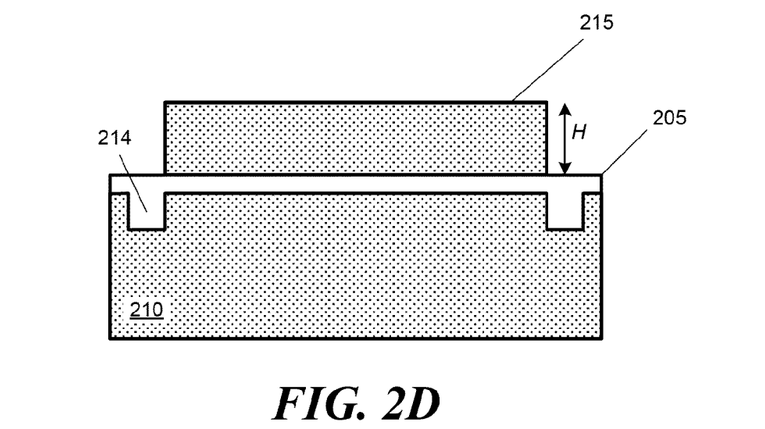
Figure 2E:
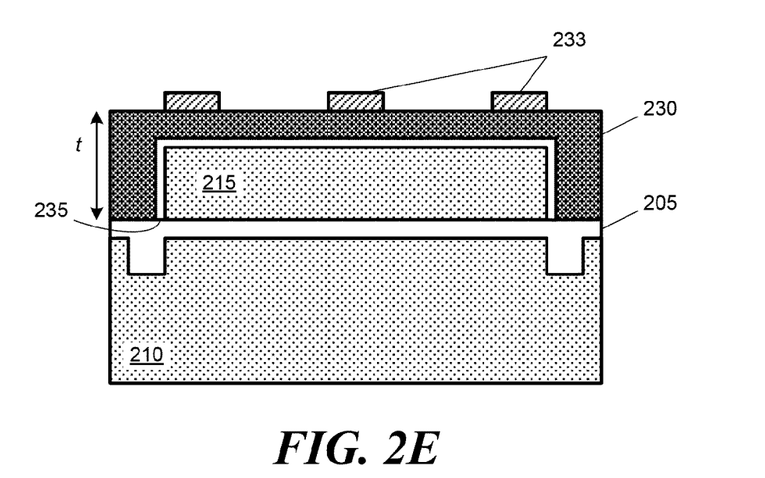
Figure 2F:
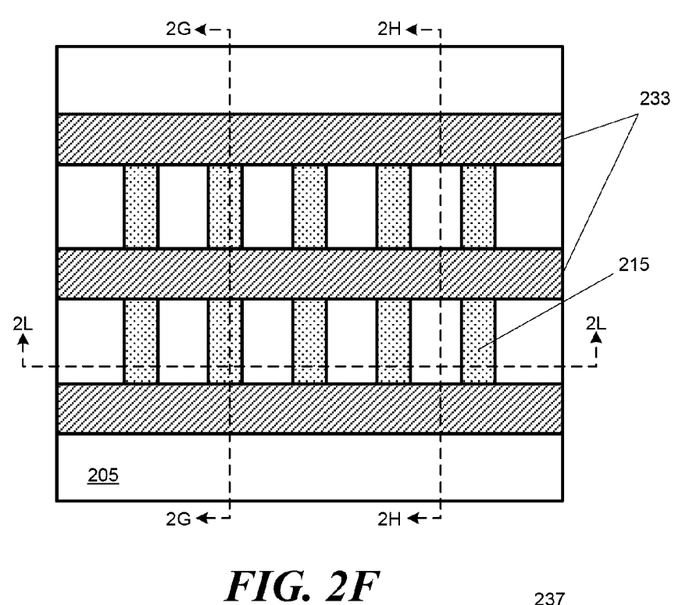
Figure 2G:
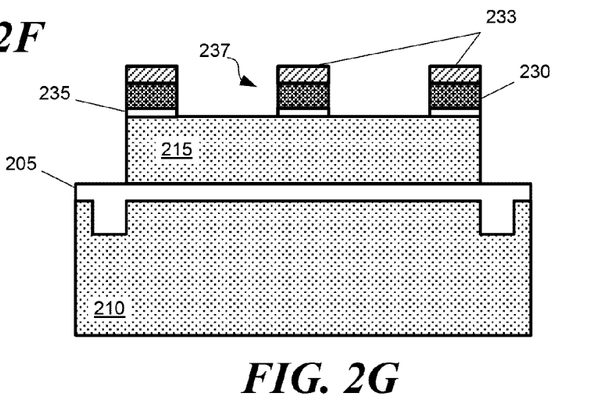
Figure 2H:
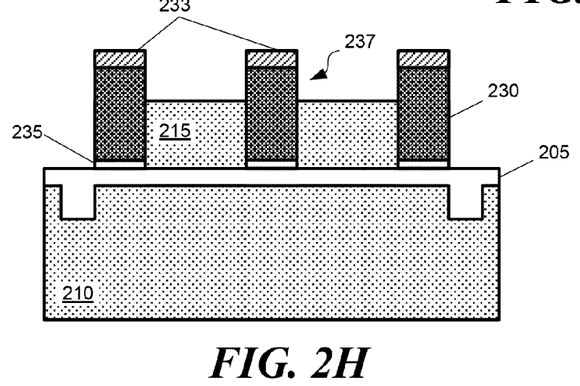
Figure 2I:
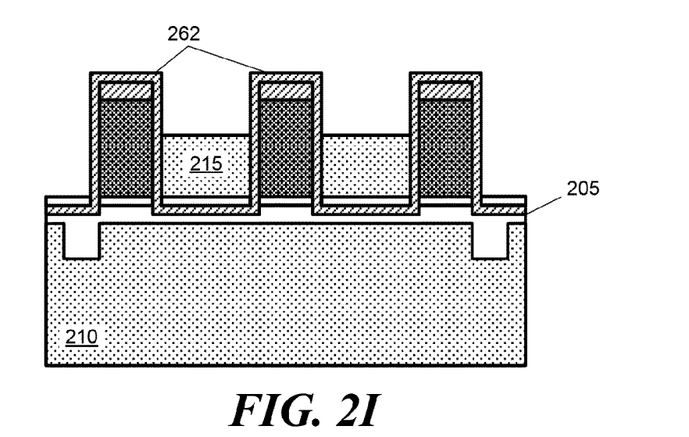
Figure 2J:
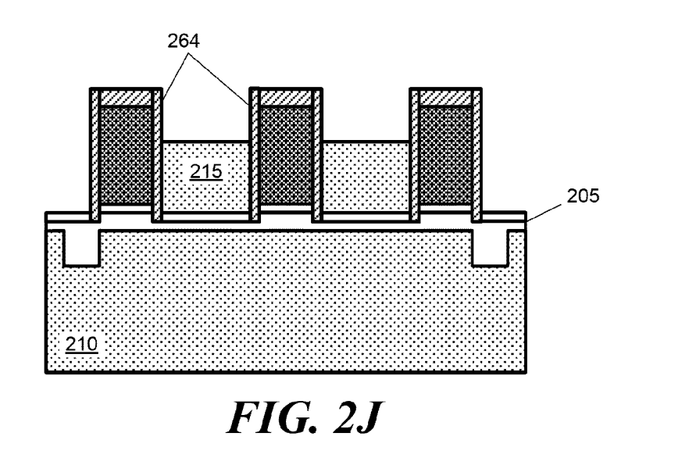
Figure 2K:
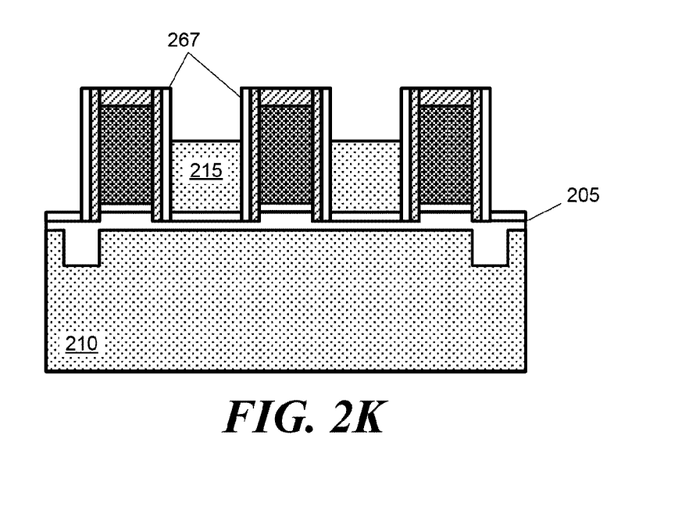
Figure 2L:
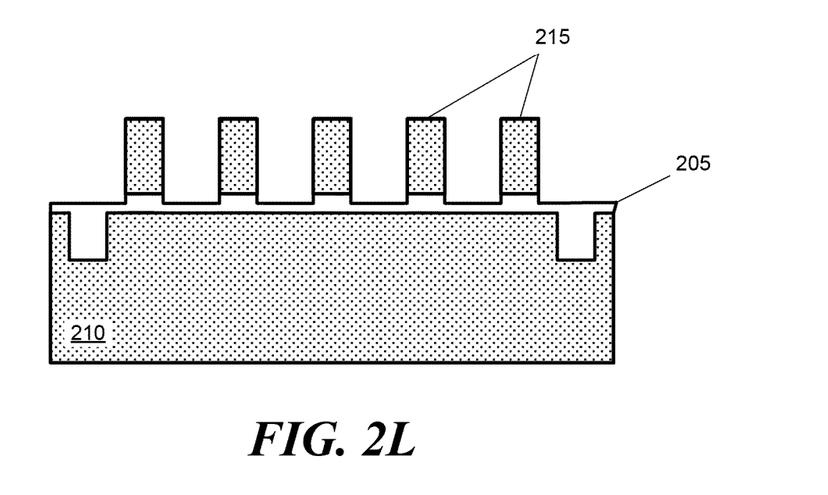
Figure 2M:
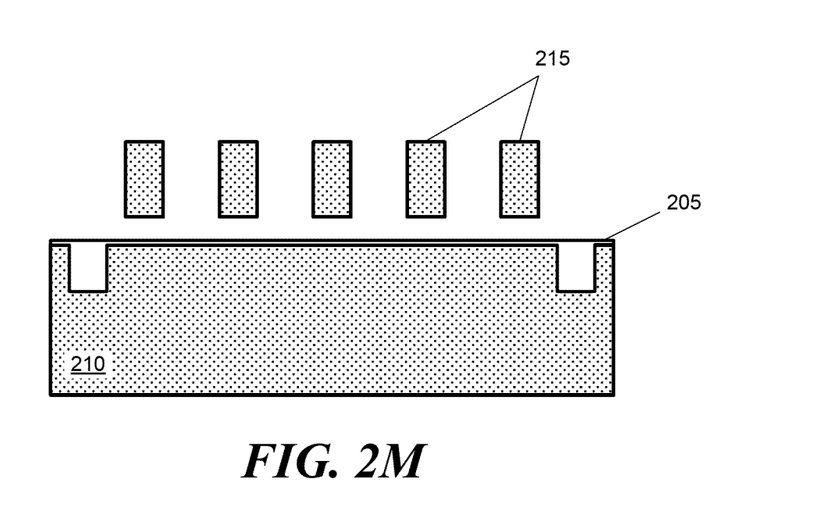
Figure 2N:
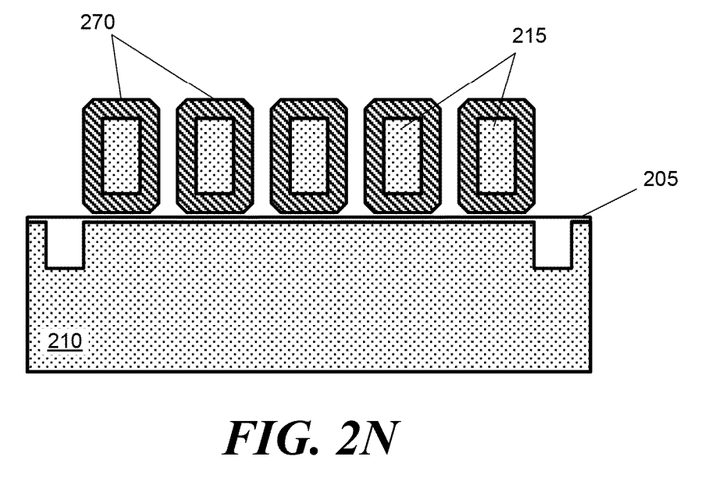
Figure 2O:
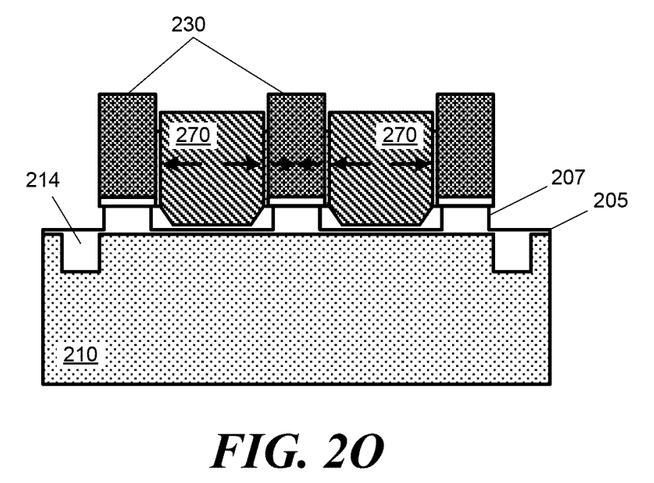

FIGS. 2A-2O depict process steps that may be used to fabricate fully-insulated, strained-channel finFETs, according to some embodiments. A process for forming fully-insulated, strained-channel finFETs may begin with a silicon-on-insulator (SOI) substrate 200, as depicted in FIG. 2A. The SOI substrate may be formed or obtained by any suitable means, and may comprise a thin semiconductor layer 212 on a thin insulating layer 205 on a bulk substrate 210. The bulk substrate 210 may be a semiconductor (e.g., Si, Ge, GaAs, InP, GaN, SiC, etc.) in some embodiments, or may be a material other than a semiconductor in other embodiments. The insulating layer 205 may be an oxide or nitride, and may have a thickness between approximately 5 nanometers (nm) and 750 nm. The insulator may be a pad oxide in some embodiments, and may be formed by any suitable process, e.g., a thermal oxidation process, plasma deposition process or ion implantation and anneal.

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The semiconductor layer 212 may be a same material as the bulk substrate 210 in some implementations, or may be a different semiconductor material than the substrate in other embodiments. In some embodiments, the semiconductor layer 212 and bulk substrate are IC semiconductor-grade, crystalline silicon (Si). A thickness of the semiconductor layer may be between approximately 20 nm and approximately 150 nm.

With reference to FIG. 2B, which illustrates a plan view of a small region of the substrate 200, fins 215 having a width W and a length L may be formed in the semiconductor layer 212. The fins may be formed by any suitable lithography process. In some embodiments, the fins may be formed by a sidewall image transfer (SIT) process that is described in further detail in U.S. patent application Ser. No. 13/964009, filed on Aug. 9, 2013, and incorporated herein by reference in its entirety. An SIT process may be referred to as a self-aligned double patterning (SADP) process. In some implementations, fins may be formed using a double patterning process, e.g., resist-on-resist patterning techniques (which may include a lithography-etch-lithography-etch (LELE) process or a lithography-freeze-lithography-etch (LFLE) process). In other embodiments, the fins may be formed by interferometric lithography, imprint lithography, photolithography, extreme ultraviolet lithography, or x-ray lithography. The width W of the fins may be between approximately 5 nm and approximately 50 nm, and the length L of the fins may be between approximately 100 nm and approximately 5 microns. In some embodiments, the width of the fins may be between approximately 1 nm and approximately 25 nm. The fins may all be of substantially a same width. In some implementations, there may be variations in fin widths over an area of the wafer, wherein the variations are more than about 20% of an average fin width. In some embodiments, the spacing $d_1$ between adjacent fins may be substantially a same value, whereas in other embodiments there may be two or more different spacings between fins.

According to some embodiments, the fins 215 may be etched from the thin semiconductor layer 212, removing material adjacent the fins and exposing the insulating layer 205. Elevation views of the etched fins are shown in FIGS. 2C-2D, according to some embodiments. The semiconductor material 212 may exhibit etch selectivity over the insulating material. For example, the semiconductor layer 212 may etch at least five to ten times faster than the insulating layer 205, so that an etch of the fins effectively stops at the insulating layer 205. The fins may have a height H that is approximately equivalent to the thickness of the semiconductor layer 212.

Isolation structures 214 may be formed around one or more fins, so as to define fins at different regions of the substrate that are more effectively isolated from adjacent regions. For example, trenches may be etched into the substrate 210 and filled with an electrically-insulating material, e.g., an oxide. In some embodiments, the isolation structures 214 may be formed using conventional shallow trench isolation (STI) processes. The isolation structures may be used to improve electrical isolation of one type of finFET device, e.g., p-channel finFETs, from an opposite type of finFET device (n-channel).

In various embodiments, gate structures are formed over one or more fins. A thin insulating layer 235 may be formed by any suitable means. The thin insulating layer 235 may be used as a gate insulator (e.g., a gate oxide), and may be formed by a thermal oxidation process or an oxide deposition and annealing process. In some embodiments, the insulating layer 235 may be formed via atomic layer deposition. The insulating layer 235 may be formed conformally over the fins 215. In some implementations, a gate conductor 230 is deposited over a region containing the fins. The gate conductor may be any suitable conductor such as polysilicon, a metal silicide, or a metal, although other materials may be used. The gate conductor 230 may be deposited with a thickness t that will more than cover the fins 215, e.g., a thickness greater than H. After deposition, the gate conductor may be planarized, e.g., by a chemical-mechanical polishing (CMP) step.

A hard mask layer (e.g., silicon nitride, silicon oxide, or a metal) may be deposited over the gate conductor 230, and subsequently patterned to define hard masks 233 for the gate structures. The patterning of the hard masks 233 may be done using any suitable lithographic process, e.g., photolithography and reactive ion etching. There may be one or more hard masks for gate structures crossing each fin, as depicted in FIG. 2E and the plan view of FIG. 2F. Although three are shown in the drawings, there may be fewer or more in other embodiments. The hard masks 233 may, or may not, be aligned with the ends of the fins 215.

Gate structures 237 may be etched from the gate conductor 230 using the hard masks 233 and any suitable anisotropic etching process, e.g., reactive ion etching. The exposed regions of the gate conductor 230 may be etched to the insulating layer 205. Because the thin insulating layer 235 is conformally deposited over the fins 215, the fins will not etch during removal of the exposed regions of the gate conductor 230. For example, the etch used to remove the gate conductor 230 does not appreciably etch the thin insulating layer 235. A subsequent isotropic etch, using a different etchant, may be used to remove the thin insulator from exposed regions of the fins 215. Cross sectional views of the substrate after etching of the gate conductor and thin insulator 235 are shown in FIGS. 2G-2H and correspond to the locations marked by the dashed lines in the plan view of FIG. 2F. Some gate structures 237 may be used as control gates of finFETs. Some gate structures (e.g., gate structures at the ends of the fins) may not be used as control gates and may be referred to as "dummy gates."

Several spacer-forming steps may then be carried out. According to some embodiments, a first spacer material may be deposited over the region covering gate structures and fins. In other embodiments, an anisotropic etch may be carried out, so as to recess the insulating layer 205 below the bottom of the fins in regions between the gate structures. Then a first spacer material 262 (e.g., silicon nitride) may be deposited conformally over the region, resulting in a structure as depicted in FIG. 2I. The amount of recess of the insulating layer 205 may be between about 5 nm and about 50 nm. The thickness of the spacer material 262 may be between approximately 10 nm and 100 nm, as measured on a horizontal surface. In the illustrations of FIGS. 2I-2K, the spacer material 262 may also forms over the fins 215, but is not shown to avoid complicating the drawings. In some implementations, the thickness of the spacer 262 that forms between the fins may be less than the thickness of the spacer that forms around the gate structures. This may occur if the fins are closely spaced (e.g., less than approximately 50 nm or less than approximately 25 nm), and the distance between the gate structures is appreciably larger (e.g., greater than approximately 100 nm). According to some embodiments, the thickness of the first spacer layer 262 is approximately equal to or greater than the height H of the fins. In other embodiments, the thickness of the first spacer layer 262 is less than the height H of the fins.

After its deposition of the spacer layer 262, an anisotropic etch (e.g., reactive ion etch) may be carried out to remove spacer material at horizontal surfaces. The etch may be a timed etch that removes the thickness of the spacer material at horizontal surfaces. After the etch, sidewall spacers 264 remain on vertical sidewalls of the gate conductors, as depicted in FIG. 2J. In some embodiments, sidewall spacers may be etched from the sides of the fins 215 during this etch, but the sidewall spacers may remain on the sides of the gate structures at the completion of this etch.

A similar spacer-forming process may be executed with a second, sacrificial spacer material to form sacrificial sidewall spacers 267 depicted in FIG. 2K. The material used for the sacrificial sidewall spacers 267 may be a same material as insulating layer 205. Alternatively, the material used for the sacrificial sidewall spacers 267 may be a material that etches at approximately a same rate in a same etchant that is used for the insulating layer 205.

The thickness of the sacrificial spacer material may be approximately equal to a width of the fin 215, in some embodiments. In some implementations, the thickness of the sacrificial spacer material may be between about one-half the width of the fin and about one-and-one-half the width of the fin. An elevation view of the fins 215 after spacer formation and removal is depicted in FIG. 2L, and corresponds to the location marked by the dashed line in FIG. 2F.

An isotropic etching process may be used to remove at least some of the insulating layer 205 beneath the fins in regions between the gate structures 237. The removal of the insulating layer 205 may form suspended source and drain regions of the finFETs. The suspended regions of the fins are depicted in FIG. 2M. The fins may be supported by one or more gate structures located at one or more regions along the fin. Because the gate structures may have a length and width greater than a width of the fins, the etch can be timed so that the insulating layer 205 will remain underneath the gate structures and connect the gate structures to the substrate 210. This can provide structural support for the suspended regions of the fin. As shown in FIG. 2M, removal of the insulating layer 205 creates voids between the fins 215 and substrate 210. The isotropic etch may also remove the sacrificial spacers 267 from the fins and gate structures. The isotropic etch may be any suitable etch (e.g., a wet or dry etch) designed to remove the sacrificial spacer material.

In some embodiments, the insulating layer 205 may be removed during the isotropic etch to expose a surface of the substrate 210 below the fins 215. In some implementations, a thin layer of the insulating layer 205 may remain after the isotropic etch, so as to provide electrical insulation between the substrate 210 and subsequent source and drain structures that include an epitaxially-grown layer surrounding the suspended source and drain regions of the fin. The resulting suspended source and drain regions of the fins may then have exposed semiconductor surfaces on four contiguous sides, as depicted in FIG. 2M. The exposed fins may comprise low defect, IC semiconductor-grade crystalline silicon of high quality suitable for finFET devices.

As depicted in FIG. 2N, epitaxial growth of a strain-inducing material 270 may be carried out in some embodiments. The strain-inducing material 270 may have a chemical composition that is different from the chemical composition of the fins 215. For example, in some embodiments, the fins may be Si and the strain-inducing material may be SiGe or SiC. Other material combinations may be used in other embodiments. FIG. 2O depicts an elevation view of a fin and gate structures, viewing the structure from a side of the fin.

There may be a thin insulating spacer layer 264 (not shown) that remains between the strain-inducing material 270 and gate conductors 230. According to some embodiments, the spacer 264 may remain on the sides of the gate structures but not on the fins 215 after an anisotropic etch. This may occur, e.g., when the fins are closely spaced and the height of the fins is appreciably less than the height of the gate conductors 230 and the height of the fin is less than the thickness of the spacer layer 262.

There may be a mismatch in lattice constants between the strain-inducing material 270 and the fin material, so that the strain-inducing material imparts strain to the adjacent fin material. For example, SiGe may be epitaxially grown over crystalline Si. The SiGe may grow under compressive stress and impart tensile stress to the adjacent Si material in the source and drain regions as it tries to relieve its stress. The source and drain regions of the fin may then include regions of tensile stress. When the epitaxy is formed only around source and drain regions of a fin, the resulting stress in the channel region of the fin may be compressive, as depicted by the bold arrows in FIG. 2O. The arrows in FIG. 2O depict the strain in the fin, and not the outer covering or strain-inducing material. In other embodiments, the strain in the channel may be reversed, by reversing the materials, or by choosing a different material combination, e.g. Si and SiC.

To achieve higher strain values in the channel regions, the epitaxial structures of adjacent fins should not merge with each other during epitaxial growth. For example, the epitaxial layers around each fin should remain detached from epitaxial layers around adjacent fins, as depicted in FIG. 2N. Additionally, epitaxial layers should not contact the underlying substrate 210 or thinned insulating layer 205. The amount of strain in the fin will increase with increasing thickness of the strain-inducing material 270. Accordingly, the space around the fins 215 may be at least about one-half the width of the fin in some embodiments, and at least the width of the fin in other embodiments.

The shape of the epitaxially-grown material 270, depicted in FIG. 2N as having eight planar surfaces, will depend upon the orientation crystal axes of the substrate with respect to the orientation of the fins. In some embodiments, the relative orientations of the crystal planes and fin direction may be selected so as to permit formation of a thicker and/or substantially uniform epitaxial layer on the four contiguous sides of the source and drain regions, in some embodiments.

The choice of fin orientation with respect to the semiconductor's crystal planes may be governed by several factors. The governing factors may include available space around the fin regions at which the epitaxy is performed. If the space is highly constrained, an orientation may be chosen such that the epitaxial layer grows uniformly thick around the exposed fin. This can permit a greater amount of strain-inducing material in the confined space without merging the epitaxy of adjacent fins. In some embodiments, a greater amount of space around the exposed fin regions may permit an orientation for which the epitaxy may form less uniformly around the fin, but is one that exhibits better coupling of induced strain from the source and drain regions to the channel regions. Alternatively or additionally, the chosen orientation may be one that exhibits a higher change in carrier mobility for a given amount of induced strain.

Since the type of channel strain (compressive or tensile) may be determined by choice of materials, the methods described for forming strained-channel finFETs may be used for n-channel and p-channel finFETs. In some embodiments, strained n-channel and p-channel finFETs may be formed on a same substrate, and the substrate may further include finFETs that do not have strained channel regions. For example, a first region of a substrate that includes p-channel finFETs may include Si fins 215 and SiGe strain-inducing material 270. A second region of the substrate that includes n-channel finFETs may include Si fins 215 and SiC strain-inducing material 270. A third region of the substrate having non-strained channels may include Si fins without strain-inducing material. The three regions of the substrate may be processed simultaneously to the point indicated in FIG. 2M. At a first time, the second and third regions may be masked so that epitaxial growth of strain-inducing material 270 will not occur at those regions. SiGe may be epitaxially grown at the first region of the substrate. At a second time, the first and third regions may be masked, and SiC may be epitaxially grown at the second region. In some embodiments, the masking of a region may be done with a hard mask (e.g., an oxide or nitride) that may be patterned with a resist. Any suitable lithography process may be used to pattern the hard masks that protect a region from epitaxial growth.

According to some embodiments, the strain-inducing material may be doped with an acceptor or donor species that determines a conductivity type (p or n) of the strain-inducing material. Following the above example, the SiGe may be doped with boron (B) or any other suitable acceptor and the SiC may be doped with phosphorus (P) or any other suitable donor. A subsequent thermal heating step may introduce dopant from the strain-inducing material 270 into the source and drain regions of the finFET device. According to some embodiments, a spike anneal process may be used to drive in the dopants. For example, the substrate may be subjected to a rapid temperature increase to a temperature in a range between about 1000° C. and about 1060° C., and then a rapid decrease in temperature. The total duration of the spike anneal ramping may be between approximately 1 to approximately 5 seconds. Alternatively or in addition, a soak anneal may be used where a high temperature may be held for a duration between approximately 1 to approximately 5 seconds. In another embodiment, the strain-inducing material may not be doped with donors or acceptors, and the source and drain regions may be doped by ion implantation and thermal diffusion.

In some embodiments, an additional step of material conversion may be carried out. In this step, the substrate may be heated to a temperature such that at least one chemical component from the strain-inducing material 270 is introduced into the source and drain regions of the fins. For example, the substrate may be heated such that Ge or C is introduced into the source and drain regions of the fins, and induces compressive strain directly in the source and drain regions, which in turn induces compressive strain in the channel regions.

Material conversion may occur by two processes. A first process is by diffusion of the chemical component into the source and drain regions at high temperatures. A diffusion process may result in a finFET structure that has enlarged source and drain regions of a different chemical composition than the channel region. For example, the source and drain regions may be SiGe, whereas the channel region may be Si. The structure may appear like that shown in FIG. 2O. A second process of conversion may occur by condensation. In this process, the fins may be covered with an oxide to help stabilize the source and drain regions. The substrate may then be heated, so as to oxidize the strain-inducing material 270 and condense the Ge or C into the fin. The resulting structure may comprise source and drain regions of the fin having a different chemical composition from the channel region, but having substantially the same cross-sectional area as the channel region. The source and drain regions may, or may not, be surrounded by an oxide.

Figure 3A:
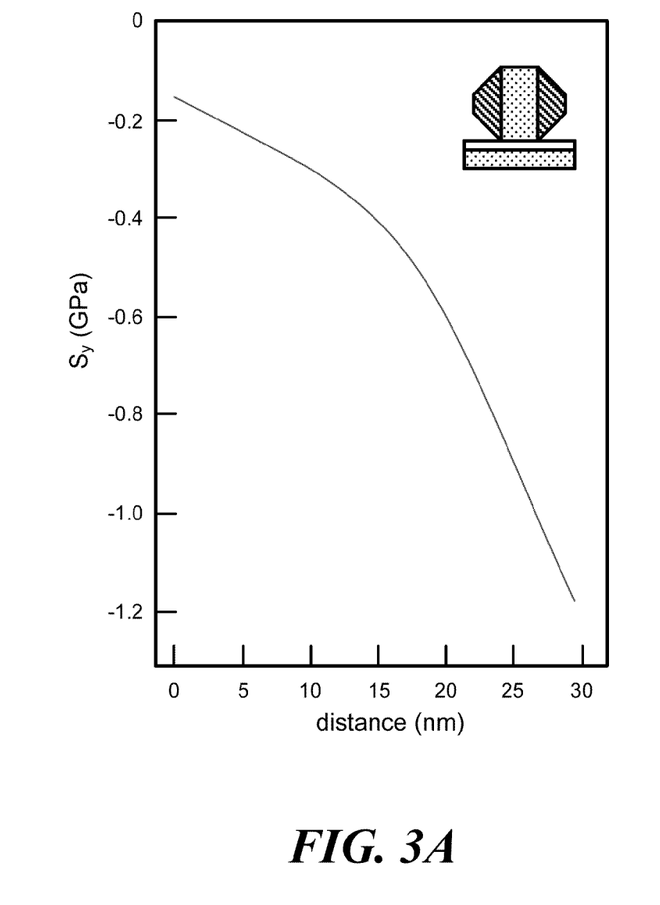
FIGS. 3A-3B show results of strain simulations for channel regions of strained-channel finFETs, according to some embodiments.
Figure 3B:
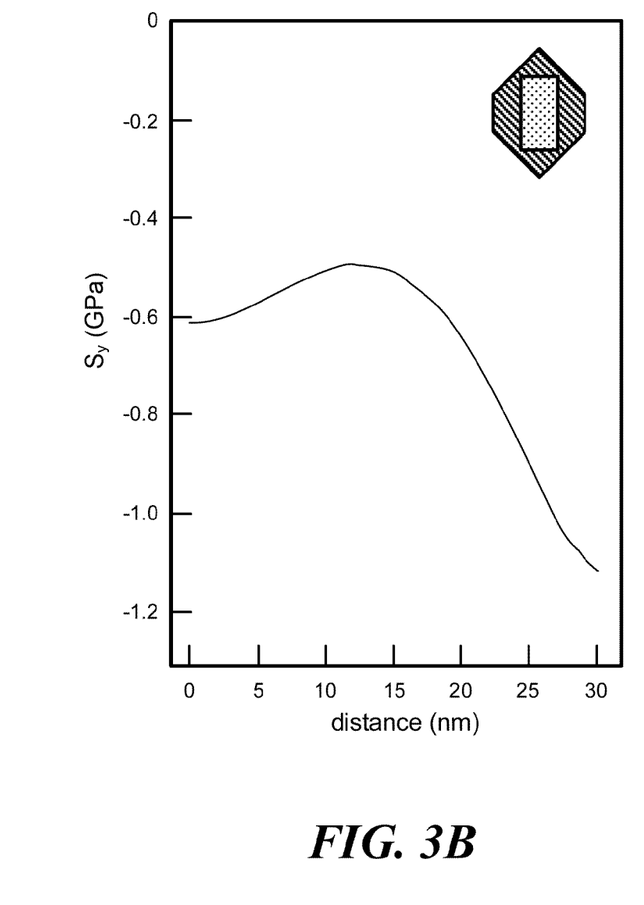

FIGS. 3A-3B are graphs of stress calculations for finFET structures that include strained channel regions. The graphs plot longitudinal stress ($S_y$) in gigaPascals (GPa) as a function of distance (in nanometers) from the bottom of the fin. Longitudinal stress is stress directed along the length of the fin. For the simulations, the height of the fin was 30 nm and the width of the fin was approximately 10 nm. The fin was Si, and SiGe was epitaxially grown over the fin's source and drain regions. The Ge percentage was 25% in the SiGe epitaxial material. The value of stress was calculated at the middle of the channel region (in terms of length along the fin).

The graph of FIG. 3A represents a case in which the SiGe was epitaxially grown on two lateral and opposite sides of the source and drain regions. Such growth may be done on conventional finFET structures that are fabricated from a planar Si layer and rest on a dielectric base or insulation layer (as depicted in the inset). For example, the fins may be fabricated in a thin silicon layer of an SOI wafer. For the case shown in FIG. 3A, the fins are oriented on the silicon such that the sidewall surfaces of the fins are parallel to the (110) crystal planes of the silicon, and the epitaxial growth is limited to the sidewalls of the fins. The graph shows that the stress at the center of the channel increases from a magnitude less than 0.2

GPa at the base of the channel to a magnitude of about 1.2 GPa at the top of the channel region.

The graph of FIG. 3B represents a case in which the SiGe was epitaxially grown on four contiguous sides of the source and drain regions, as described in the above methods. For this case, the fins are also oriented such that the sidewall surfaces of the fins are parallel to the (110) crystal planes of the silicon. However, since the underlying insulator has been etched back to create a void between the fin and substrate, the epitaxy of the strain-inducing material occurs on the four contiguous faces of the exposed fin regions. The graph shows that the stress at the center of the channel increases from a magnitude of more than 0.6 GPa at the base of the channel to a magnitude of about 1.2 GPa at the top of the channel region. The improvement in strain in the channel region at the base of the channel is more than a factor of three. Additionally, the stress is more uniform over the height of the channel region.

The orientation of the fins with respect to the crystalline planes of the semiconductor can affect several parameters of the device. The orientation may affect the shape and amount of epitaxy on the exposed fin surfaces, the efficiency of coupling strain from the source and drain regions of the fin to the channel region, and the amount of change in mobility of the carriers due to the induced strain. For example, when the sidewalls of the fins are parallel to the (110) crystal planes for Si, the epitaxy tends to form a diamond shape around the fin (as depicted in the inset of FIG. 3B) and there is better coupling of strain from the source and drain regions to the channel region. When the sidewalls of the fins are parallel to the (100) crystal planes for Si, the epitaxy tends to form in a more uniformly-thick layer around the fin (as depicted in FIG. 2N) and there is less coupling of strain from the source and drain regions to the channel region. Because changes in mobility due to strain can also depend on crystal orientation, some orientations of fin directions with respect to crystalline planes may be preferred over other orientations to increase carrier mobility in the channel region. For a Si—SiGe epitaxial layer, the inventors have found that an orientation of fins having sidewalls of the fins parallel to the (110) crystal planes yield a higher carrier mobility in the channel region than for an orientation with fin sidewalls parallel to the (100) planes. Although the examples described above are primarily directed to Si/SiGe semiconductor combinations, other semiconductor combinations may be used in other embodiments. For example, equivalent process steps may be implemented for GaAs, GaN, InP, and other semiconductor materials.

Although the processing steps depicted in FIGS. 2A-2O illustrate some embodiments for forming fully insulated finFETs, in other embodiments, there may be additional steps or fewer steps.

The fins shown in the drawings may be spaced laterally from each other on one or more regular spacing intervals. For example, there may be a uniform lateral spacing $d_1$ between all fins. Alternatively, there may be two uniform lateral spacings $d_1$, $d_2$ alternating between successive fins. The fins may have a width between approximately 5 nm and approximately 30 nm. The fins may be spaced apart between approximately 10 nm and approximately 50 nm. There may be one or more fins per finFET device. A finFET device fabricated according to the present teachings may be formed in an integrated circuit in large numbers and at high densities. The circuits may be used for various low-power applications, including but not limited to, circuits for operating smart phones, computers, tablets, PDA's and other consumer electronics.

Although the foregoing methods and structures are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around (GAA) transistors.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for making a strained-channel, fully-insulated finFET, the method comprising:
    forming a fin structure for a finFET in first semiconductor material at a surface of a substrate;
    forming suspended source and drain regions in the fin;
    epitaxially growing a strain-inducing material on four contiguous surfaces surrounding the source region; and
    epitaxially growing a strain-inducing material on four contiguous surfaces surrounding the drain region.

2. The method of claim 1, wherein the strain-inducing material has a chemical composition that is different from the chemical composition of the first semiconductor material.

3. The method of claim 2, wherein the strain-inducing material comprises SiGe or SiC and the first semiconductor material comprises Si.

4. The method of claim 3, wherein forming a fin comprises orienting the fin such that a sidewall of the fin is parallel to a (110) plane of the Si semiconductor material.

5. The method of claim 1, wherein depositing the strain-inducing material comprises doping the strain-inducing material with donors or acceptors.

6. The method of claim 1, wherein the strain-inducing material does not merge with strain-inducing material deposited on an adjacent fin.

7. The method of claim 1, further comprising heating the substrate to a temperature that converts the source and drain regions to a material having a chemical composition different from the chemical composition of the first semiconductor material.

8. The method of claim 7, wherein the converted source and drain regions include a chemical component from the strain-inducing material that induces stress in the source and drain regions.

9. The method of claim 1, further comprising forming voids under the source and drain regions.

10. The method of claim 1, wherein a width of a fin is between approximately 1 nm and approximately 25 nm.

11. The method of claim 1, wherein a spacing between any two adjacent fins is between approximately 10 nm and approximately 50 nm.

12. The method of claim 1, further comprising forming the fin by a sidewall image transfer process.

13. The method of claim 1, wherein the fin has a width between approximately 1 nm and approximately 25 nm and a height between approximately 20 nm and approximately 50 nm.

14. A strained-channel finFET structure comprising:
a source region of a first semiconductor material having a first chemical composition and surrounded on four contiguous sides by a strain-inducing material having a second chemical composition that is different from the first chemical composition;
wherein the strain-inducing material is epitaxially grown on the source region.

15. The strained-channel finFET structure of claim 14, further comprising a void between the strain-inducing material and a substrate on which the finFET structure is formed, wherein the void isolates at least part of the source region from the substrate.

16. The strained-channel finFET structure of claim 14, wherein the strain-inducing material comprises SiGe or SiC and the first semiconductor material comprises Si.

17. The strained-channel finFET structure of claim 16, wherein a sidewall of a fin of the finFET structure is parallel to a (110) crystal plane of the first semiconductor material.

18. The strained-channel finFET structure of claim 14, wherein the strain-inducing material is doped with donors or acceptors.

19. The strained-channel finFET structure of claim 14, wherein the strain-inducing material surrounding a first source region on a first fin does not merge with strain-inducing material surrounding a second source region on a second fin adjacent the first fin.

20. The strained-channel finFET structure of claim 14, wherein a width of the fin is between approximately 1 nm and approximately 25 nm.

21. The strained-channel finFET structure of claim 14, wherein a spacing between any two adjacent fins is between approximately 10 nm and approximately 50 nm.

22. The strained-channel finFET structure of claim 14, wherein the fin has a width between approximately 1 nm and approximately 25 nm and a height between approximately 20 nm and approximately 50 nm.

23. The strained-channel finFET structure of claim 14, further comprising a gate structure surrounding three sides of the fin and connected to a substrate via an insulating layer.

* * * * *